(12) United States Patent
Sanwal et al.

(10) Patent No.: US 11,017,145 B1
(45) Date of Patent: May 25, 2021

(54) SYSTEM AND METHOD FOR REPEATING A SYNCHRONIZED SET OF LAYOUT GEOMETRIES

(71) Applicant: Cadence Design Systems, Inc., San Jose, CA (US)

(72) Inventors: Ashwani Kumar Sanwal, Barnota Dom (IN); Vandana Gupta, Delhi (IN); Devendra Deshpande, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/703,284

(22) Filed: Dec. 4, 2019

(51) Int. Cl.
*G06F 30/392* (2020.01)
*G06F 3/0482* (2013.01)
*G06F 3/0484* (2013.01)
*G06F 30/31* (2020.01)

(52) U.S. Cl.
CPC .......... *G06F 30/392* (2020.01); *G06F 3/0482* (2013.01); *G06F 3/04845* (2013.01); *G06F 30/31* (2020.01)

(58) Field of Classification Search
USPC ........................................................ 716/119
See application file for complete search history.

(56) References Cited

U.S. PATENT DOCUMENTS

| | | | |
|---|---|---|---|
| 7,917,877 B2 | 3/2011 | Singh et al. | |
| 7,971,174 B1 | 6/2011 | Khalsa et al. | |
| 8,239,797 B1 | 8/2012 | Ghosh et al. | |
| 9,830,417 B1 | 12/2017 | Ginetti et al. | |
| 9,842,183 B1 | 12/2017 | Ginetti et al. | |
| 10,223,495 B1 | 3/2019 | Agrawal et al. | |
| 10,354,034 B1 | 7/2019 | Agrawal et al. | |
| 2003/0229868 A1* | 12/2003 | White | H01L 21/3212 716/53 |
| 2008/0216038 A1* | 9/2008 | Bose | G06F 30/392 716/118 |
| 2012/0089953 A1* | 4/2012 | Baum | G03F 1/30 716/51 |
| 2012/0129301 A1* | 5/2012 | Or-Bach | H01L 27/10897 438/129 |

* cited by examiner

*Primary Examiner* — Mohammed Alam
(74) *Attorney, Agent, or Firm* — Vista IP Law Group, LLP

(57) ABSTRACT

Embodiments disclosed are directed to systems and methods for modifying an electronic circuit design. According to embodiments, the method includes generating a circuit element of an electronic circuit layout on a graphical user interface, and generating an array group including a plurality of circuit elements. Each cell of the array group includes the same circuit element, and the array group is generated such that a change in at least one attribute of the array group is applied to each circuit element of the plurality of circuit elements.

20 Claims, 13 Drawing Sheets

1400 ─╲

┌─ 1402
Generate a circuit element of an electronic circuit layout on a graphical user interface (GUI)

┌─ 1404
Generate an array group including a plurality of circuit elements, wherein each cell of the array group includes a same circuit element, and the array group is generated such that a change in attribute of the array group is applied to each circuit element of the plurality of circuit elements

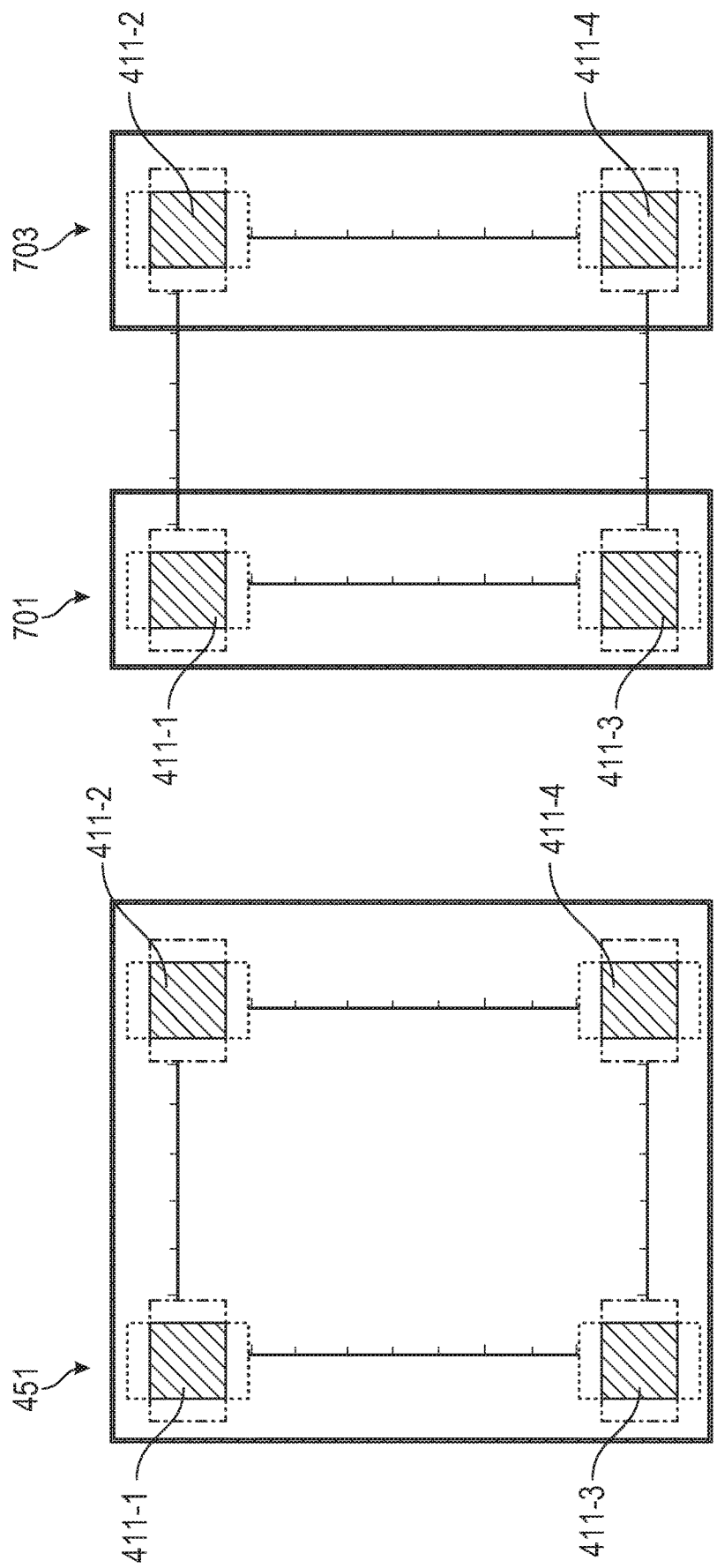

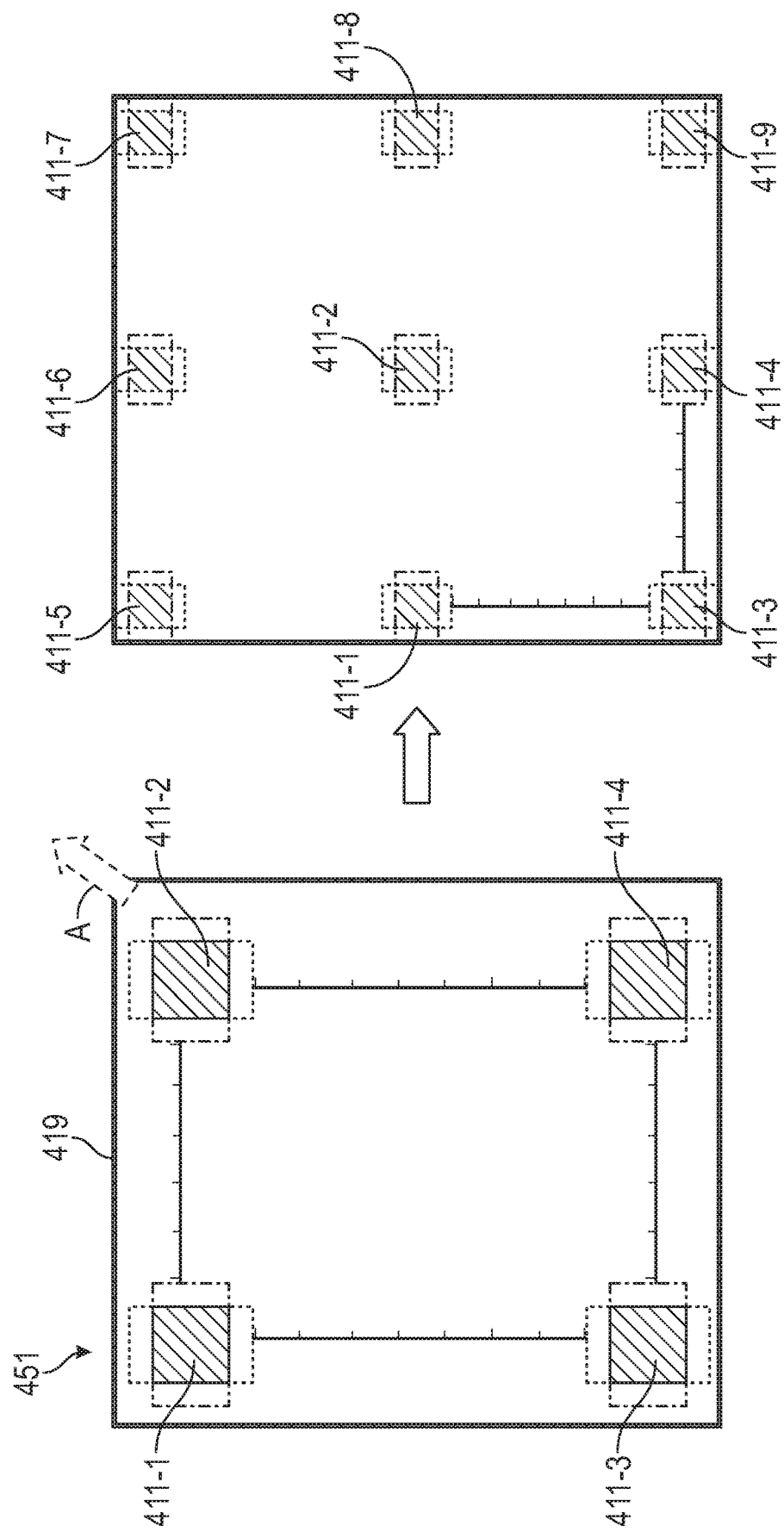

SYSTEM AND METHOD FOR REPEATING A SYNCHRONIZED SET OF LAYOUT GEOMETRIES

TECHNICAL FIELD

Embodiments of the disclosure generally relate to integrated circuits and the design of these circuits using electronic design automation (EDA) technologies, and more specifically, to systems and methods for generating and synchronously editing multiple circuit elements (e.g., gates, transistors, etc.) when designing integrated circuits.

BACKGROUND

Integrated circuits or chips are used in most products that have electronic components. A typical integrated circuit (IC) design is initially conceived and tested schematically by a circuit designer, with a number of components and devices connected to generate a circuit with desired performance and characteristics.

A large number of components in the IC are facilitated with an Electronic Design Automation (EDA) tool (software) that allows the circuit designer to position and connect various shapes on the IC. The circuit designer creates a custom design of such ICs, printed-circuit boards, and other electronic circuits containing the physical locations and dimensions of the circuit's components, interconnections, and various layers from the original design that may then be fabricated using EDA technologies that typically run on an operating system in conjunction with a processor-based computer system. EDA tools typically generate a layout corresponding to circuit elements (e.g., gates, transistors, etc.) of the IC. Some circuit elements are replicated multiple times in the layout. When designing the IC, circuit designers may need to make the same changes to each such repetitive circuit element.

The description provided in the background section should not be assumed to be prior art merely because it is mentioned in or associated with the background section. The background section may include information that describes one or more aspects of the subject technology

SUMMARY

In a first embodiment, a method is described that includes generating a first circuit element of an electronic circuit layout on a graphical user interface and generating an array group including a plurality of first circuit elements. The array group is generated such that a change in at least one attribute of the array group is applied to each first circuit element of the plurality of first circuit elements.

In a second embodiment, a non-transitory, computer-readable medium storing instructions is described. The instructions, when executed by a processor, direct the processor to perform a method. The method includes generating a plurality of circuit elements of an electronic circuit layout on a graphical user interface. Each circuit element of the plurality of circuit elements is similar. The method further includes selecting the plurality of circuit elements and generating an array group including the plurality of circuit elements. A change in at least one attribute of the array group is applied to each circuit element of the plurality of circuit elements.

In yet another embodiment, a system is described that includes a user interface for displaying an electronic circuit layout of an integrated circuit, a memory device that stores instructions, and a processor configured to execute the instructions for performing a method for modifying the electronic circuit layout using one or more electronic design automation (EDA) tools. The method includes generating a circuit element of the electronic circuit layout and generating an array group including a plurality of circuit elements. Each cell of the array group includes the same circuit element, and a change in a design of a circuit element of the plurality of circuit elements of the array group is replicated in each other circuit element of the plurality of circuit elements.

In a further embodiment, a system is described that includes a means for generating a circuit element of an electronic circuit layout on a graphical user interface and a means for generating an array group including a plurality of circuit elements. Each cell of the array group includes the same circuit element, and the array group is generated such that a change in an attribute of the array group is applied to each circuit element of the plurality of circuit elements.

BRIEF DESCRIPTION OF THE DRAWINGS

The accompanying drawings, which are included to provide further understanding and are incorporated in and constitute a part of this specification, illustrate disclosed embodiments and together with the description serves to explain the principles of the disclosed embodiments. In the drawings:

FIG. 7A illustrates an array group of circuit elements before a chop operation.

FIG. 7B illustrates array groups of circuit elements after the chop operation.

FIG. 8A illustrates an array group of circuit elements before a stretch operation.

FIG. 8B illustrates array groups of circuit elements after the stretch operation.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

Circuit designers typically use electronic design automation (EDA) tools (software) such as a layout editor implemented on a graphical user interface to design a layout of integrated circuits. Electronic circuit layout of integrated circuits include same circuit element(s) (also referred to as design elements) arranged in a repetitive pattern. Each such circuit element may be a single circuit component, for example, a single photodetector of an image sensor including a plurality of photodetector, or may be a collection of two or more circuit components, for example, memory cell and its associated control circuit, that collectively perform a function. During the course of designing the integrated circuit, the circuit designer may need to increase or decrease the number of such repetitive circuit elements. Additionally or alternatively, the circuit designer may need to increase or decrease the spacing between adjacent circuit elements. In other instances, a circuit designer may need to make the same design changes to each circuit element. Typically, an integrated circuit includes hundreds and thousands of such repetitive circuit elements. Individually adding or removing circuit elements, or individually changing spacing between circuit elements or individually making design changes to each circuit element is a laborious and time-intensive process that is prone to errors.

Some existing techniques require a circuit designer to execute multiple operations (or commands) in order to change the number of circuit elements or to change the spacing between adjacent circuit elements. For instance, the number of circuit elements can be increased by copying one or more circuit elements and pasting them a required number of times to obtain the required number of circuit elements. Similarly, circuit elements can be deleted to reduce their number. Another way to create desired circuit elements is using vector instances. However, this technique introduces another level of design hierarchy, which is undesirable. To change the spacing, using existing techniques, each circuit element will have to be individually moved to increase or decrease the spacing. In order to make design changes, existing techniques require the circuit designer to the make the same changes to each individual circuit element.

Figure 1:
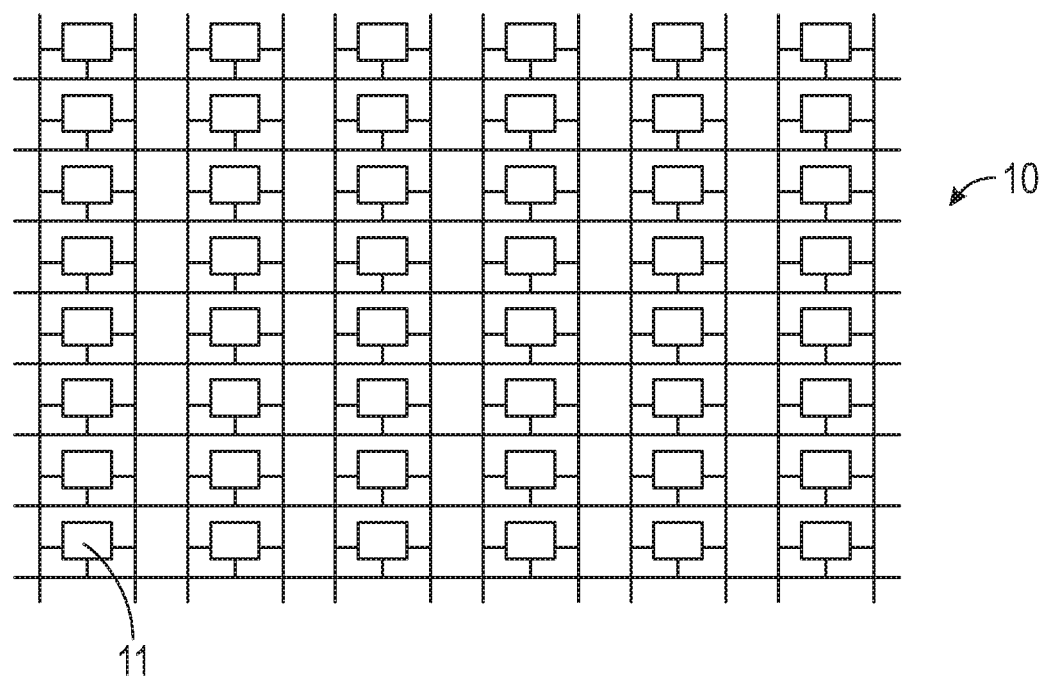
FIG. 1 illustrates an example memory array including multiple circuit elements.

FIG. 1 illustrates an example memory array 10 including multiple circuit elements, e.g., memory cells 11. As illustrated, the memory cells 11 are arranged in a matrix pattern including rows (n) and columns (m). As mentioned, the circuit designer may need to increase the number of memory cells 11 or it may be required to increase the separation between the memory cells 11. Additionally or alternatively, the circuit designer may need to make a same design change to each memory cell 11.

It is desirable to change the number of circuit elements using a minimal number of commands (steps) and/or to replicate any change in the spacing between a single circuit element and the circuit elements adjacent thereto to all circuit elements forming the integrated circuit. In addition, changes to a circuit element need to be duplicated to all circuit elements. It is advantageous to make these changes without introducing a new level of hierarchy.

Embodiments of the disclosure are directed to systems and methods for creating a programmable array group that includes a plurality of circuit elements of an electronic circuit layout design. In the array group (also referred to simply as an array), the plurality of circuit elements are arranged in an array, wherein each cell of the array includes the same circuit element. Stated otherwise, a same circuit element is repeated across all rows and columns of the array. According to embodiments disclosed herein, the number of circuit elements of the array group can be changed by changing the number of rows and/or columns of the array. According to various embodiments of the disclosure, changes to spacing between a circuit element and circuit elements adjacent thereto in the array group are duplicated to each circuit element in the array group. Additionally, using the embodiments of the disclosure, any change to a design of a circuit element in the array group are synchronously applied to all other circuit elements in the array group. Embodiments according to the disclosure provide the above features while permitting different logical connectivity of each cell. Logical connectivity, as used herein, refers to connectivity between circuit components based on the schematic connectivity (circuit specification) without having a physical connection between circuit components. Thus, each member of array group can be assigned separate logical and/or physical connectivity, as per the design requirements. Embodiments of the disclosure are implemented using electronic design automation (EDA) technologies, such as a layout editor displayed on a graphical user interface for enabling a user to change the number of rows and the number of columns of the array of circuit elements, and to change the horizontal spacing and the vertical spacing between adjacent circuit elements.

The embodiments of the present disclosure are implemented as a feature or application in electronic design automation (EDA) technologies, such as a custom integrated circuit (IC) design system, having a graphic circuit designer interface or layout editor running program code to assist a circuit designer to generate and implement customized electronic circuit layout designs. Although the present disclosure can be implemented to run with custom design systems, it is understood that the present disclosure is not limited to the embodiments described herein. Some embodiments may be implemented with known or later-developed EDA technologies or hardware description languages that manipulate electronic circuit layout designs using the techniques disclosed herein.

Figure 2:
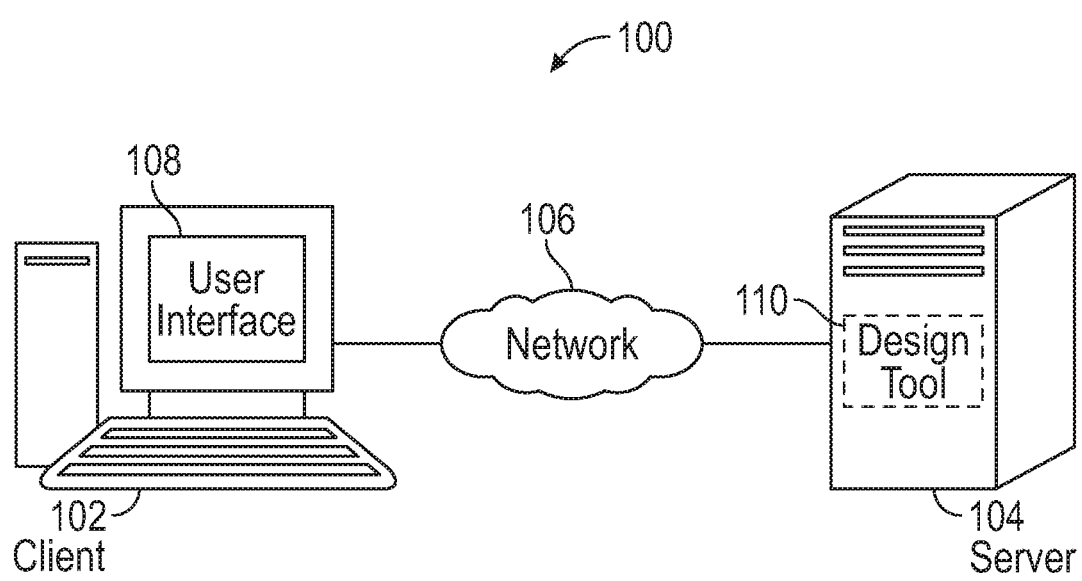
FIG. 2 illustrates an electronic design automation system, according to an embodiment of the disclosure.

FIG. 2 illustrates an electronic design automation system 100, according to an embodiment of the disclosure. The electronic design automation system 100 includes a client computing device 102 and a server 104. The client computing device 102 is connected to the server 104 via a network 106. The network 106 is a medium that also connects various computing devices and database of the electronic design automation system 100. Examples of the network 106 include, but are not limited to, LAN, WLAN, MAN, WAN, and the Internet. The communication over the network 106 is performed in accordance with various communication protocols such as Transmission Control Protocol and Internet Protocol (TCP/IP), Circuit designer Datagram Protocol (UDP), and IEEE communication protocols.

A client computing device 102 is any computing device comprising a processor and that executes various tasks and processes described herein, such as generating, displaying, updating, and receiving inputs from a circuit designer via a graphical user interface 108. Non-limiting examples of the client computing device 102 include a desktop computer, a laptop, a personal digital assistant (PDA), a tablet computer, and the like. The client computing device 102 communicates with the server 104 through the network 106 using wired or wireless communication capabilities.

The client computing device 102 facilitates a circuit designer accessing a computer-readable storage medium in the server 104. The computer-readable storage medium, for example, stores electronic design layouts and pattern libraries. In an embodiment, layout rules for the layouts are derived from design rules of a fabrication process. The layout rules include limitations on the design features that require adjustments to the features and shapes. The term "computer-readable memory device" or "computer-readable storage medium" as used herein refers to any medium or media that participates in providing instructions or data to a processor for execution. Such a medium may take many forms, including, but not limited to, non-volatile media, volatile media, and transmission media. Non-volatile media include, for example, optical disks, magnetic disks, or flash memory. Volatile media include dynamic memory. Transmission media include coaxial cables, copper wire, and fiber optics, including the wires that comprise a bus. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

A server 104 is a computing device comprising a processor and computer-readable storage media capable of executing the various tasks and processes described herein, and is accessible to client computing devices 102 via the one or more networks 106. The graphical user interface 108 receives instructions regarding a layout design from the circuit designer, and utilizes the optimization procedures stored in the memory device to facilitate optimization of the layout design and the execution of the editing process described herein. The server 104 further has a design tool 110. The design tool 110 accesses the memory device (e.g., store data, update data, query data, retrieve data), and may be configured to perform the editing procedures according to embodiments described herein. The circuit designer interacts with the design tool 110 through a number of input devices such as by inputting a selection as with a mouse or inputting a request as with a keyboard. The circuit designer may observe the response to the access request on an output device or display. The design tool 110 may run in an application window controlled by the circuit designer. In some aspects, the server 104 can be a cloud computing server of an infra-structure-as-a-service (IaaS) and be able to support platform-as-a-service (PaaS) and software-as-a-service (SaaS).

In some embodiments, the client computing device 102 executes a design tool and accesses a memory device. The client computing device 102 may be any computing system that executes the design tool or otherwise facilitates access to a database or other memory device storing layouts, pattern libraries, netlist files, and/or templates. In other embodiments, multiple client computing devices 102 may access the memory device via the networks 106 and request access to the objects stored therein.

Figure 3:
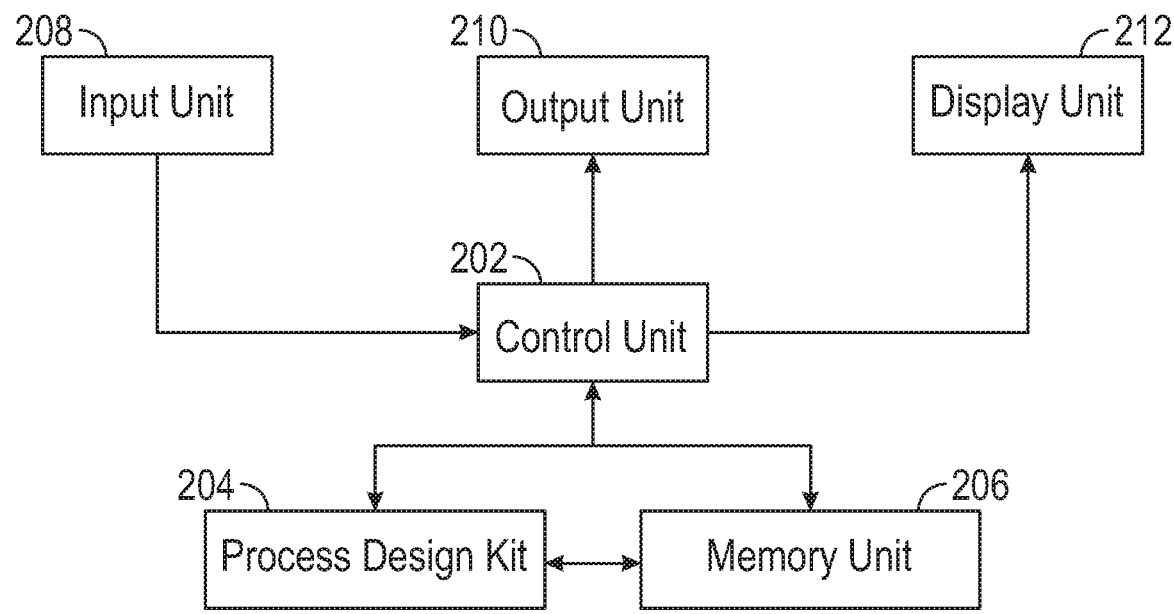
FIG. 3 is a block diagram depicting components of an electronic design automation system 200, according to an exemplary embodiment.

FIG. 3 is a block diagram depicting components of an electronic design automation system 200, according to an exemplary embodiment. The electronic design automation system 200 includes a control unit 202, a process design kit (PDK) 204, a memory unit 206, an input unit 208, an output unit 210, and a display unit 212. In some embodiments, the components of electronic design automation system 200 are connected via an interconnect bus. In other embodiments, the control unit 202 and the memory unit 206 are connected via a local processor bus, and the remaining units of the electronic design automation system 200 are connected via one or more input/output buses. For the purposes of the discussion in FIG. 3, the electronic design automation system 200 may be or include one or more computing devices, such as clients and/or servers described in FIG. 2.

A control unit 202 implements a processor system to control the operations of the electronic design automation system 200. The control unit 202 may include a single processor or a plurality of processors, where a processor includes executable logic, circuitry, and interfaces that are operable to execute one or more instructions to perform predetermined operations/tasks described herein. The processor of the control unit 202 may include an x86 processor, an ARM processor, a Reduced Instruction Set Computing (RISC) processor, an Application-Specific Integrated Circuit (ASIC) processor, or a Complex Instruction Set Computing (CISC) processor. In some embodiments, the control unit 202 includes a Graphics Processing Unit (GPU) that executes the set of instructions to perform one or more processing operations for graphical outputs, separate from the processor. The control unit 202 further includes a software-based graphic design environment executing software programs to assist the circuit designer in generating and streamlining layout designs.

A PDK 204 may be software instructions executable by the control unit 202, or any number of other components of the electronic design automation system 200, and may contain information specific to a particular design task (such as editing functions) and other tasks including libraries of symbols, views, and binary files provided in various machine-readable file formats. The PDK 204 has an interface interconnected with the control unit 202 to enable a circuit designer to access cell level design solutions and optimize layout designs interactively via the input unit 208 and the display unit 212. The assortment of libraries of the PDK 204 can be collections of one or more circuit designs stored in digital formats, and may be accessible by the control unit 202. The circuit design may be any circuit design that includes digital logic elements. The examples of digital logic elements include AND gates, OR gates, NOT gates, NOR gates, NAND gates, XOR gates, XNOR gates, and/or combinational logic circuits, such as flip-flops, shift-registers, multiplexers and de-multiplexers. The examples of the electronic circuit design include a microcontroller unit (MCU), system-on-chip (SOC), and application specific integrated circuit (ASIC) design. The digital content of the library may be stored locally, or accessed remotely via a computer network.

A memory unit 206 is a non-volatile storage device for storing computer-readable data and instructions, used by the control unit 202 and/or other components of the electronic design automation system 200. The memory unit 206 is implemented with a magnetic disk drive, an optical disk drive, a solid state device, or an attachment to network storage. The memory unit 206 may comprise one or more memory devices to facilitate storage and manipulation of program code, set of instructions, tasks, electronic designs, data, PDKs, and the like. Non-limiting examples of memory unit 206 implementations may include, but are not limited to, a random access memory (RAM), a read-only memory (ROM), a hard disk drive (HDD), a secure digital (SD) card, a magneto-resistive read/write memory, an optical read/write memory, a cache memory, or a magnetic read/write memory. Further, the memory unit 206 includes one or more instructions that are executable by the processor of the control unit 202 to perform specific operations. The support circuits for the processor include conventional cache, power supplies, clock circuits, data registers, I/O interfaces, and the like. The I/O interface may be directly coupled to the memory unit 206 or coupled through the processor of the control unit 202.

An input unit 208 may be a keyboard, mouse, pointer, or other input generating device to facilitate input of control instructions by the circuit designer to the control unit 202. In one embodiment, the input unit 208 provides a portion of the circuit designer interface for the electronic design automation system 200, and may include an alphanumeric keypad for inputting alphanumeric and other key information along with a cursor control device such as a mouse, a trackpad or stylus. An output unit 210 of the electronic design automation system 200 facilitates physical implementation of a circuit designers' custom designs by providing a direct link to manufacturing processes at a silicon level or a chip level. A display unit 212 of the electronic design automation system 200 may include a cathode ray tube (CRT) display, liquid crystal display (LCD), plasma, or light emitting diode (LED) display. A graphics subsystem may receive textual and graphical information and process the information for output to the display unit 212.

In some embodiment, array groups provided using the PDK 204 are accessed by the circuit designer by way of a graphical user interface or layout editor visualized by the display unit 212. The display unit 212 may also visualize a graphical user interface or layout editor having a design mode and an edit mode to enable generation and editing of the array groups created in custom electronic circuit designs as described herein.

Figure 4A:
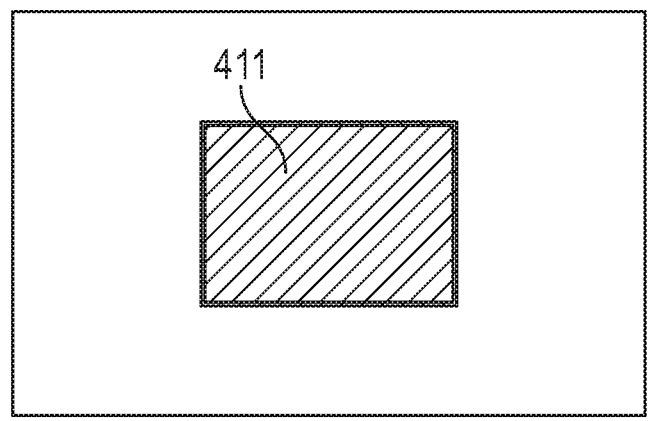
FIG. 4A illustrates a single circuit element.

An array group may be created during the course of electronic circuit design in order to make the same changes to a plurality of circuit elements. In an embodiment, the user selects (e.g., using a mouse) a desired circuit element (also referred to as an object of the array) from the electronic circuit design layout in the layout editor. The circuit element is the one from which an array of the circuit elements is to be designed. FIG. 4A illustrates a single circuit element 411 that is selected for creating an array of circuit elements 411. When the circuit element 411 is selected, an attribute window is displayed for changing one or more attributes (or properties) related to the array. FIG. 4C illustrates an attribute window 400 that is displayed on a graphical user interface for editing one or more attributes of an array group including a plurality of circuit elements, according to some embodiments.

The attribute window 400 (also referred to as an option form) is invoked from a dropdown menu (e.g., FILE menu) of the electronic design automation (EDA) tool, such as a layout editor, used for designing the electronic circuit design.

The attribute window 400 includes a field 401 for providing a desired name (ArrayGroup0, in this case) to the array group, a row field 403, a column field 405, an X Spacing field 407, and a Y Spacing field 409. The row field 403 is used to provide the desired number of rows in the array group. The column field 405 is used to provide a desired number of columns in the array group. The default number of rows and columns in the array group are 1, since a single circuit element 411 is selected. The X Spacing field 407 is used to provide the horizontal separation (0.07 units, in this case) between adjacent circuit elements in the array. The Y Spacing field 409 is used to provide the vertical separation (0.07 units, in the case) between adjacent circuit elements in the array. The default X spacing and Y spacing values are zero.

The user (circuit designer) can change the values of the number of rows, number of columns, the X Spacing, and the Y Spacing in the respective fields 403, 405, 407, and 409. Once the desired values have been input in the respective fields, the user then selects (e.g., clicks using mouse) the APPLY button and the array group is created.

Figure 4B:
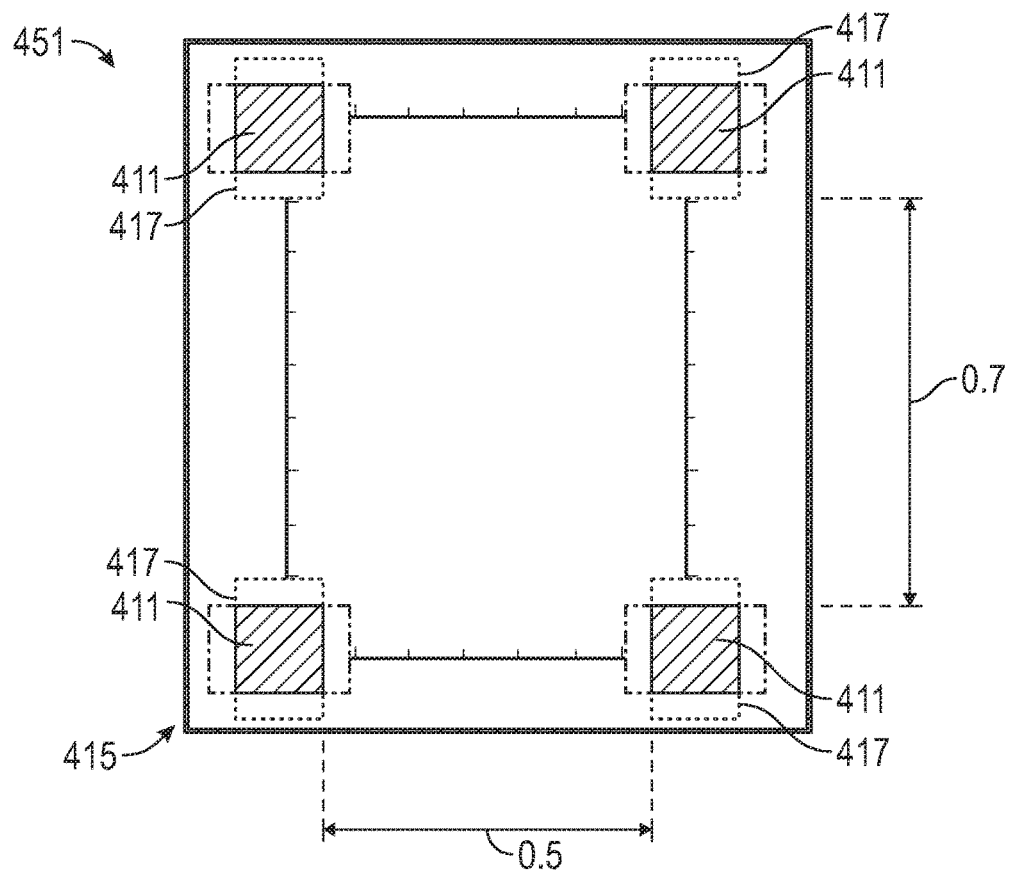
FIG. 4B illustrates an array including multiple circuit elements of FIG. 4A.
Figure 4C:
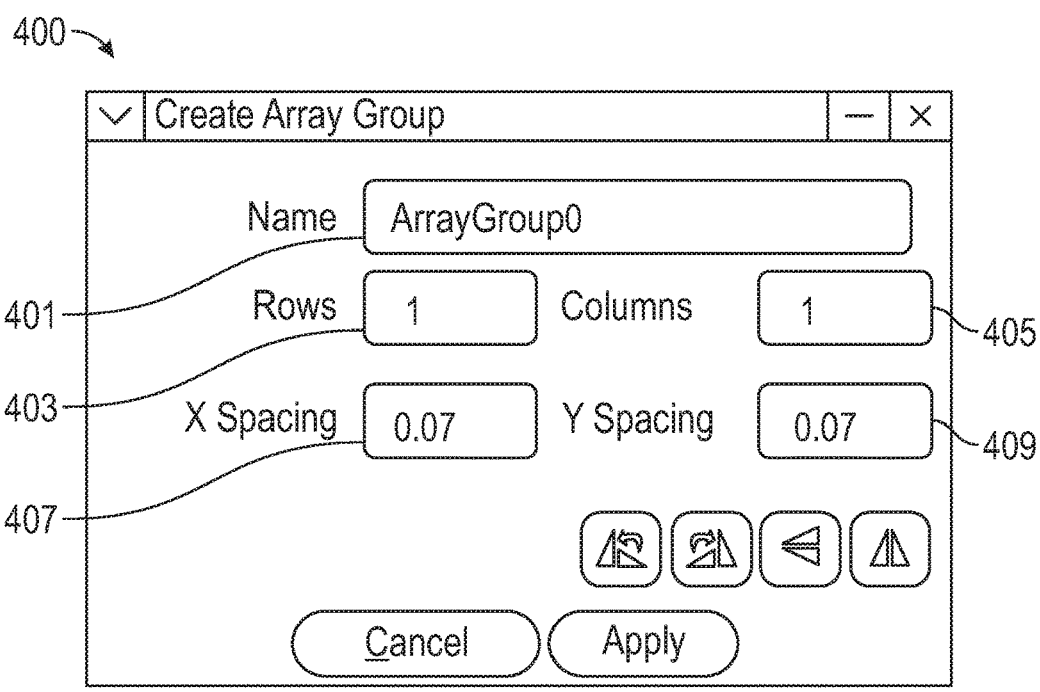
FIG. 4C illustrates an attribute window that is displayed on a graphical user interface for creating an array group including a plurality of circuit elements, according to some embodiments.

FIG. 4B illustrates an array group 451 of circuit elements 411 obtained by changing the number of rows to 2, number of columns to 2, the X Spacing to 0.5, and the Y Spacing to 0.7 in the attribute window 400. Thus, as illustrated, the array group 451 includes 4 circuit elements 411, separated vertically from each adjacent circuit element 411 by 0.7 units and separated horizontally from each adjacent circuit element 411 by 0.5 units. As illustrated, each circuit element 411 is bounded by a bounding box 417 that indicates the boundary within which the circuit element 411 is contained. The X Spacing and the Y Spacing is measured as the separation between bounding boxes 417. The horizontal and vertical separation values are greater than zero, thereby indicating that the circuit elements 411 (specifically, the bounding boxes 417) do not contact each other, and that the circuit elements 411 in an array do not overlap each other.

Figure 5:
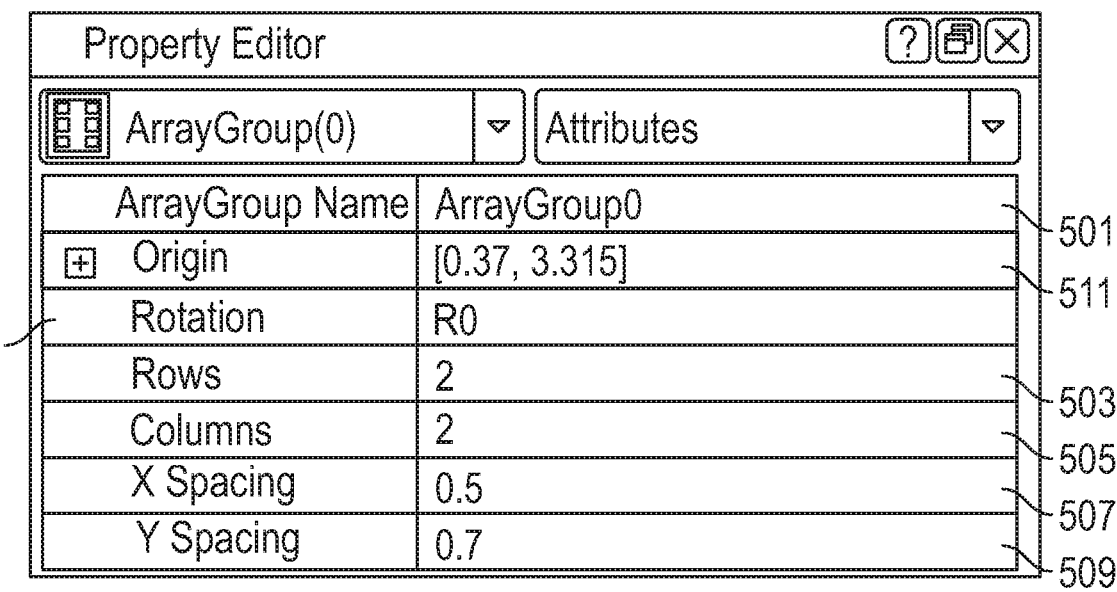
FIG. 5 illustrates a property editor window, according to some embodiments of the disclosure.

In some embodiments, the values of the number of rows, number of columns, the X Spacing, and the Y Spacing in the respective fields 403, 405, 407, and 409 can be edited using a property editor. FIG. 5 illustrates a property editor window 500, according to some embodiments of the disclosure. The property editor window 500 may be displayed alongside the array group 451 and identifies the attributes of the array group 451. The property editor window 500 identifies the name (or label) of a selected array group (ArrayGroup0, in this case) in the ArrayGroup Name field 501. The property editor window 500 also indicates the number of rows of the array group in the Rows field 503, the number of columns of the array group in the Columns field 505, the horizontal separation between adjacent circuit elements in the X Spacing field 507, and the vertical separation between adjacent circuit elements in the Y Spacing field 509. The user can edit one or more of the fields 503, 505, 507, and 509 as desired to change the respective properties of the array group.

The property editor window 500 also includes an Origin field 511 that indicates the location on the layout editor where the origin of the array group is located. As illustrated, the origin, indicated as 415 (FIG. 4B), of the array group is located at [0.37, 3.315]. The property editor window 500 also includes a Rotation field 513 that indicates the rotation of the array group with reference to the horizontal direction. In FIG. 5, a rotation of 0 degrees is indicated as R0. Other rotations such as R90 and R180 are also possible, as discussed below.

Figure 6B:
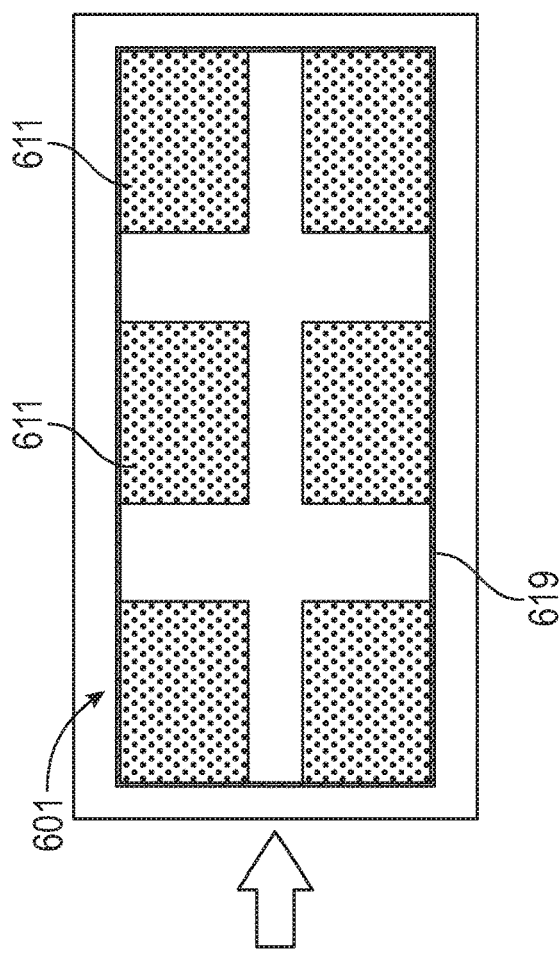
FIG. 6B illustrates an array group formed by grouping circuit elements in FIG. 6A.
Figure 6A:
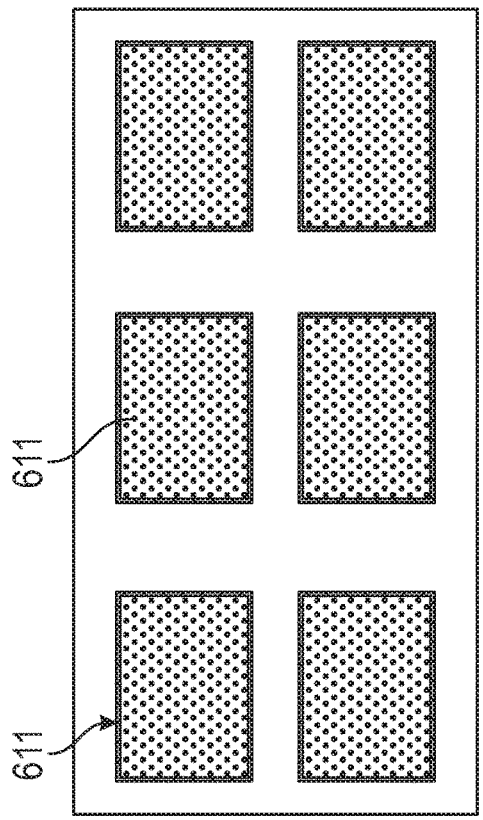
FIG. 6A illustrates individual circuit elements.

In some other embodiments of the disclosure, in order to generate an array group of circuit elements, the user can select a desired number of circuit elements in a layout of the electronic circuit design, for example, by highlighting the circuit elements using the mouse. In this case, the arrangement of the circuit elements would be recognized from the selected set by the tool (e.g., layout editor). If there are repeated patterns with uniform spacing (e.g., equal spacing between circuit elements in the horizontal direction, or equal spacing between circuit elements in the vertical direction), then the tool will automatically determine the number of rows and columns, and the individual circuit elements will be grouped to create an array group. FIG. 6A illustrates individual circuit elements 611 and FIG. 6B illustrates an array group 601 of circuit elements 611. As illustrated, the circuit elements 611 are selected together. The tool determines that the circuit elements 611 are similar and are arranged in a pattern. The tool then generates an array group 601 of the circuit elements 611 enclosed within a boundary box 619. In some embodiment, when the array group 601 is created, an attribute window, similar to the attribute window 400, is displayed. The attribute window displays the attributes of the array group 601.

Due to a change in the number of circuit elements and/or due a change in the spacing between the circuit element, there will be a change in the lengths of the interconnects between circuit elements of the array group and also a change in the lengths of the interconnects between the circuit elements and one or more other circuit layers of the electronic circuit design. In such instances, the tool will recreate (rewire) the interconnects between circuit elements, and the interconnects between the circuit elements and one or more other circuit layers of the electronic circuit design.

Thus, from the discussion above, it will be understood that embodiments of the disclosure enable a user (circuit designer) to create an array group of multiple circuit elements from a single circuit element. Embodiments of the disclosure also enable a user to generate an array group from existing circuit elements in an electronic circuit design layout. By grouping similar circuit elements in an array group, a user is able to duplicate changes made to a single circuit element of the array group to all other circuit elements of the array group. Thus, the user can substantially reduce the time and effort required to make the changes to multiple circuit elements, and reduce the errors in the design process. Additional advantages of the embodiments can be realized from the discussion below. Embodiments of the disclosure provide additional features for manipulating an array group including a plurality of circuit elements in numerous other ways to further edit the layout of the circuit elements.

One such feature is a chop operation that is used to separate an array group of circuit elements into 2 or more separate array groups including one or more circuit elements of the original array group. FIG. 7A illustrates the array group 451 of circuit elements 411 (individually labelled as 411-1, 411-2, 411-3, and 411-4) before a chop operation and FIG. 7B illustrates array groups 701 and 703 formed after the chop operation. After the user has selected the desired circuit elements 411 to be separated (for instance, circuit elements 411-2 and 411-4) from the array group 451, the user selects (e.g., from a drop down menu in the layout editor) the chop operation. In the illustrated example, the 2×2 array group 451 is separated into two 2×1 array groups 701 and 703. The array group 701 includes circuit elements 411-1 and 411-3 and the array group 703 includes circuit elements 411-2 and 411-4.

Another feature is a stretch operation that is used to increase or decrease the number of circuit elements in an existing array group by changing the size of a boundary box enclosing the array group. FIG. 8A illustrates the array group 451 (FIG. 4B) enclosed by a boundary box 419 and including circuit elements 411 (individually labelled as 411-1, 411-2, 411-3, and 411-4). In some embodiments, the user may select an upper right corner of the boundary box 419 (e.g., click and hold using the mouse) and drag the corner diagonally in the direction indicated by arrow A to increase the size of the boundary box 419. As the size (area) of the boundary box 419 increases, new circuit elements are added. For the purposes of discussion herein, a "new circuit element" refers to a circuit element that was absent in the original array group prior to changing a size of the array group. As illustrated in FIG. 8B, new circuit elements 411-5, 411-6, 411-7, 411-8, and 411-9 are added. The new circuit element are added such that the X Spacing and Y Spacing separation between adjacent circuit elements is equal to the values in the respective fields 507 and 509 (in this case, 0.5 units and 0.7 unit, respectively). Thus, a 3×3 array group of circuit elements is obtained from a 2×2 array group of circuit elements.

It will be understood that circuit elements get added each time the horizontal and/or vertical separation between the circuit elements and the boundary box 419 is equal to (or greater than) the X Spacing and Y Spacing values indicated in the attribute window 400.

Similarly, the number of circuit element can be reduced by reducing the size of the boundary box. For instance, by dragging the boundary box 419 in the opposite direction of the arrow A, one or more circuit elements 411 can be deleted from the array group 451.

It should be noted that the size of the boundary box 419 can also be changed (increased or decreased) only in the horizontal or vertical direction to change the respective X Spacing or Y-Spacing values. For example, instead of dragging the boundary box 419 diagonally, if the boundary box 419 is dragged horizontally, then only circuit elements 411-8 and 411-9 would be obtained. Thus, a 2×3 array group of circuit elements is obtained from a 2×2 array group of circuit elements. Similarly, if the boundary box 419 is dragged vertically, then only circuit elements 411-5 and 411-6 would be obtained. Thus, a 3×2 array group of circuit elements is obtained from a 2×2 array group of circuit elements.

According to embodiments, any design changes made to a single circuit element, for example, using a "Edit-In-Place" (EIP) operation, is synchronously replicated to all other circuit elements of the array group. Thus, any design change made to circuit element 411 in the array group 451 is synchronously replicated in all other circuit elements 411.

Figure 9:
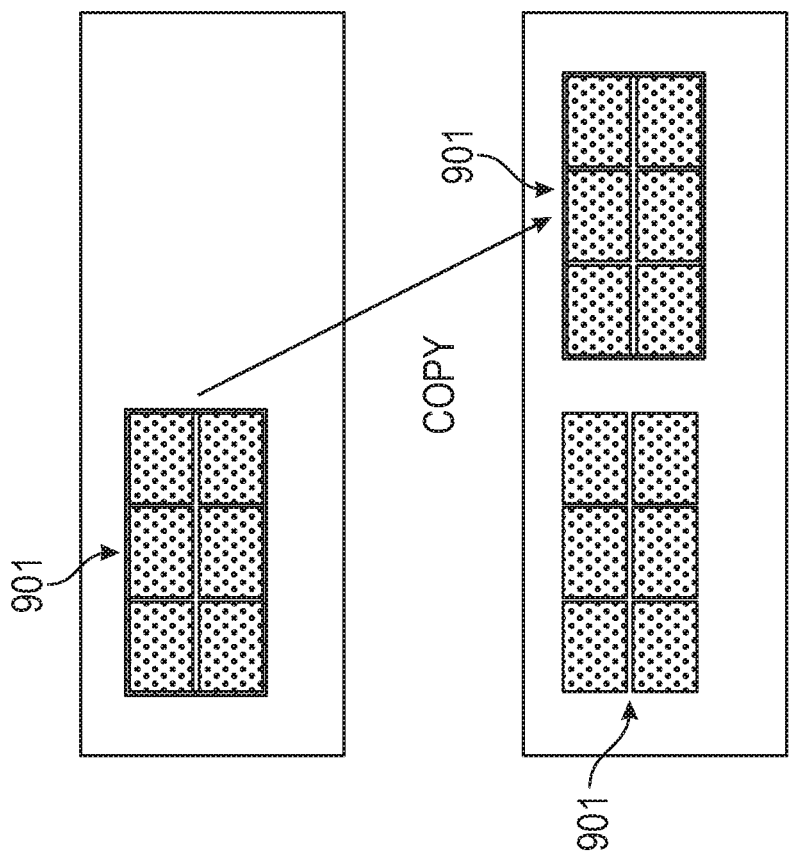
FIG. 9 illustrates a copy operation, according to embodiments of the disclosure.

Embodiments of the disclosure also enable the user to copy an array group of circuit elements in an electronic circuit design from one location in the electronic circuit design to one or more other locations in the electronic circuit design. Additionally or alternatively, the array group can be copied to a different electronic circuit design. When copying an array group, the original array group remains intact. FIG. 9 illustrates a copy operation, according to embodiments of the disclosure. As illustrated, an array group 901 is copied to another location in the electronic circuit design. The copy operation can be accessed from a drop down menu of the layout editor.

Figure 10:
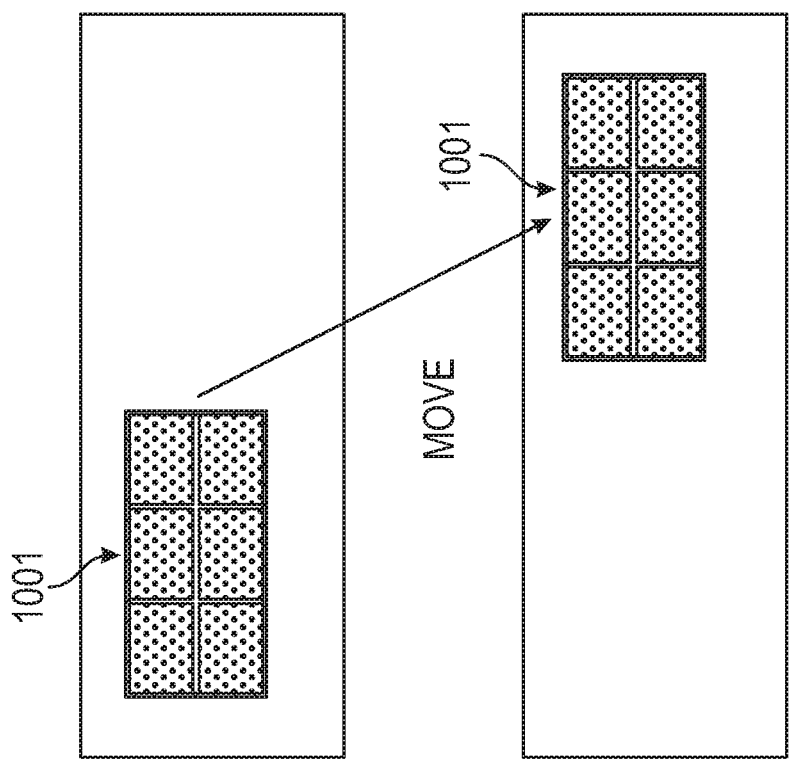
FIG. 10 illustrates a move operation, according to embodiments of the disclosure.

Embodiments of the disclosure also enable the user to move an array group of circuit elements in an electronic circuit design from one location in the electronic circuit design to another location in the electronic circuit design. FIG. 10 illustrates a move operation, according to embodiments of the disclosure. As illustrated, an array group 1001 is moved to another location in the electronic circuit design. Additionally or alternatively, the array group can be moved to a different electronic circuit design. The move operation can be accessed from a drop down menu of the layout editor.

Figure 11A:
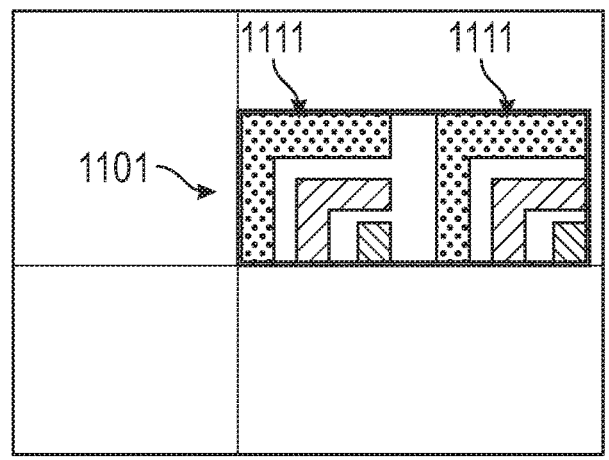
FIG. 11A illustrates an array group at an angle of 0°.
Figure 11B:
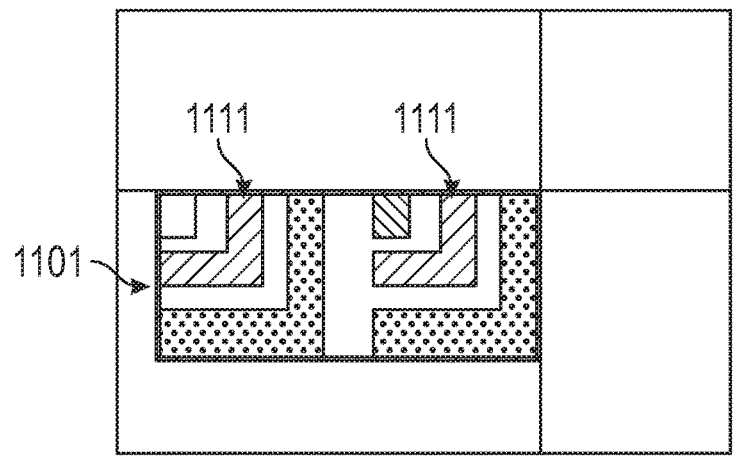
FIG. 11B illustrates the array group in FIG. 11A rotated clockwise 180° from the position in FIG. 11A.
Figure 11C:
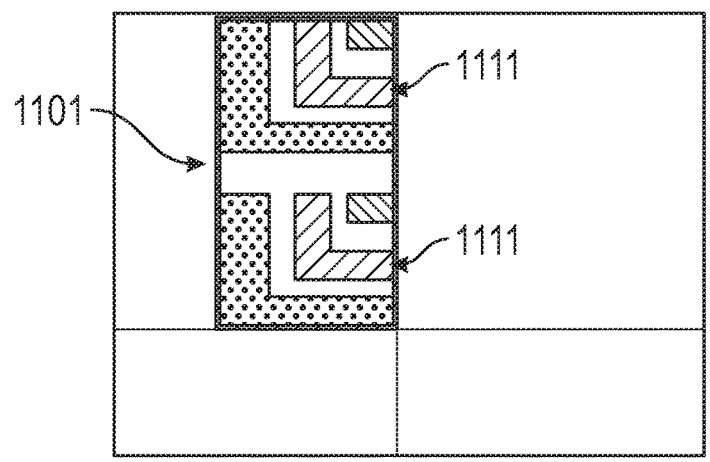
FIG. 11C illustrates the array group in FIG. 11A rotated 90° counter-clockwise from the position in FIG. 11A.

Embodiments of the disclosure also enable the user to rotate an array group of circuit elements in an electronic circuit design. The rotation is with reference to the horizontal axis and an angle between the array group and the horizontal axis is considered as 0° by default. The array group can be rotated 90° or 180°. FIG. 11A illustrates an array group 1101 at an angle of 0° (default angle). The rotation is referred to as R0. The array group 1101 includes two circuit elements 1111 arranged in a 1×2 format. FIG. 11B illustrates the array group 1101 rotated counter-clockwise 180° from the position in FIG. 11A. The rotation is referred to as R180. FIG. 11C illustrates the array group 1101 rotated 90° counter-clockwise from the position in FIG. 11A. The rotation is referred to as R90. Alternatively, the array group 1101 can be rotated 270° clockwise from the position in FIG. 11A to obtain the same position of the array group 1101 in FIG. 11C. The rotate operation can be accessed from a drop down menu of the layout editor.

Figure 12:
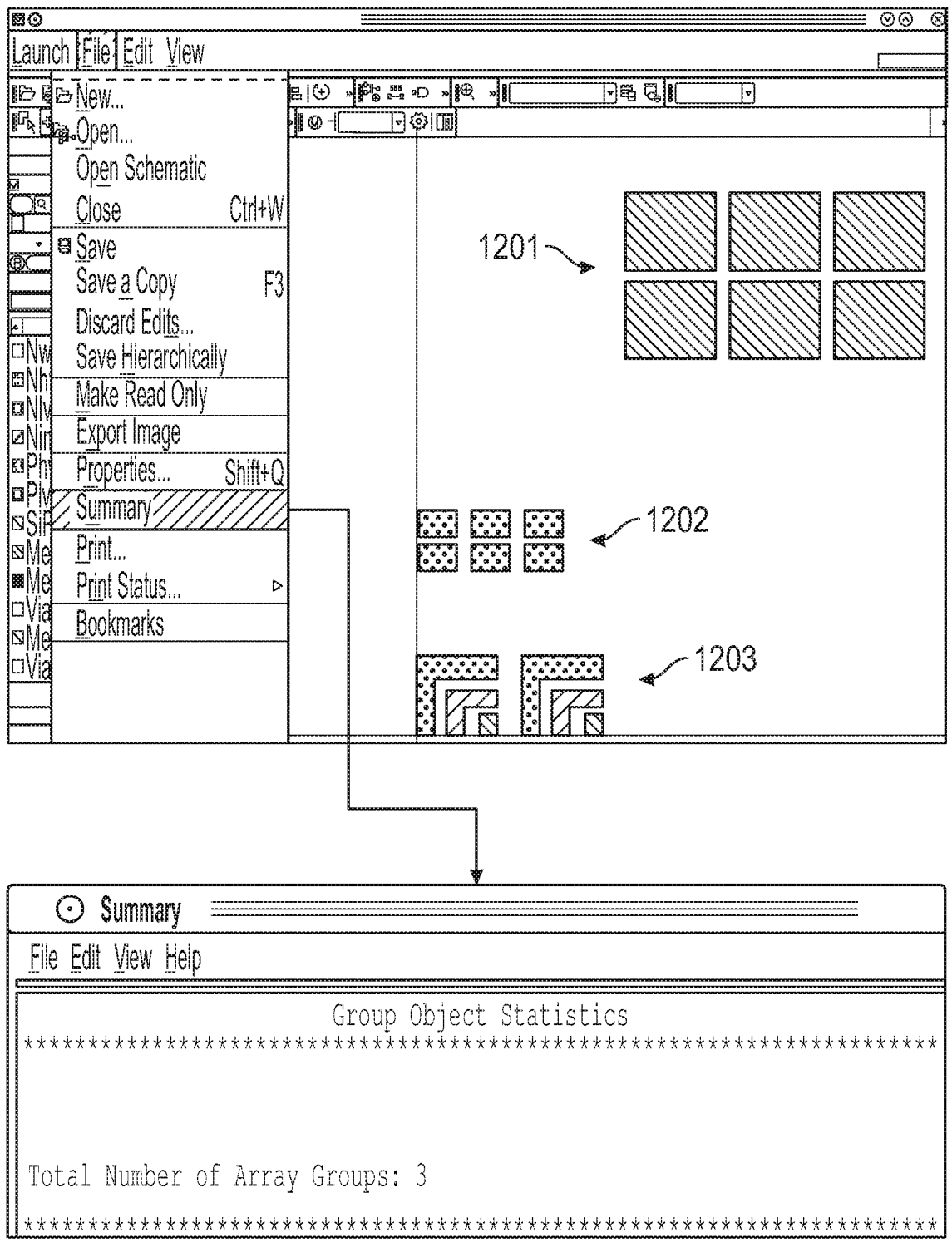
FIG. 12 illustrates a summary operation performed on multiple array groups created in a layout editor, according to embodiments of the disclosure.

Embodiments of the disclosure also enable the user to obtain a summary of the number of array groups in a layout of an electronic circuit design. The summary operation can be accessed from a drop down menu of the layout editor. FIG. 12 illustrates multiple array groups created in a layout editor, according to embodiments of the disclosure. As illustrated, after the summary operation has been selected, a report including the number of array groups is obtained. The layout editor includes 3 array groups 1201, 1202, and 1203. The report thus indicates the total number of array groups as 3.

Embodiments of the disclosure also enable the user to ungroup an array group to separate out the individual circuit elements of the array group. After an array group has been ungrouped, the individual circuit elements are no longer a part of the original array group. Thus, any change made to an individual circuit element is not duplicated in the other circuit elements. Additionally, any change in the design of an individual circuit element is not synchronously replicated in the other circuit elements. Each individual circuit element can be manipulated individually. In some embodiments, new array groups can be created from the separated circuit elements using the methods discussed above. It should be noted that X spacing and Y Spacing attributes are no longer applicable to the ungrouped individual circuit elements since these are attributes of an array group.

Figure 13:
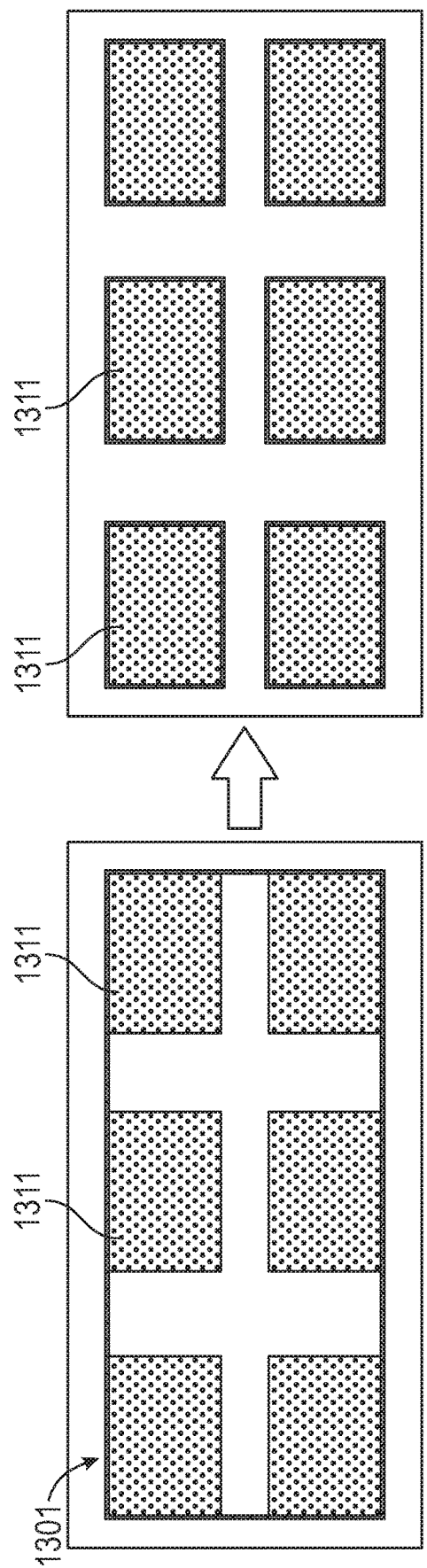
FIG. 13A illustrates an array group including multiple circuit elements before an ungroup operation.
FIG. 13B illustrates the array group after the ungroup operation.

An ungroup operation can be considered to be a reverse of the operation discussed with reference to FIGS. 6A and 6B in which individual circuit elements were grouped to form an array group. FIG. 13A illustrates an array group 1301 including multiple circuit elements 1311. After an ungroup operation, the circuit elements 1311 in the array group 1301 are separated out and individual circuit elements 1311 are obtained, as illustrated in FIG. 13B.

Figure 14:
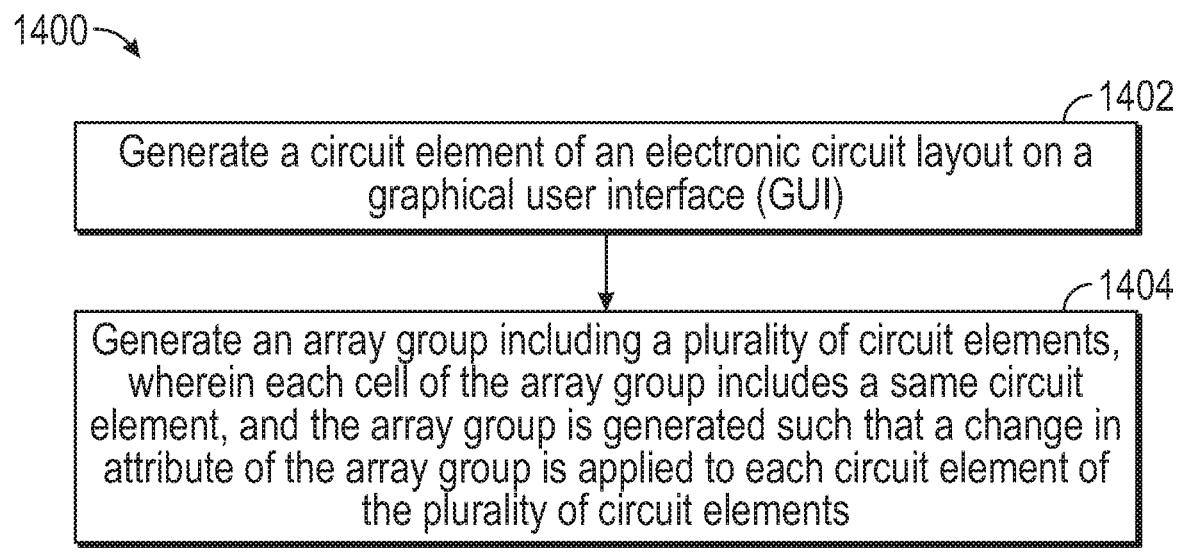
FIG. 14 is a flowchart including steps in a method for modifying an electronic circuit design, according to some embodiments.

FIG. 14 is a flowchart including steps in a method 1400 for modifying an electronic circuit design, according to some embodiments. Method 1400 may be performed at least partially by the electronic design automation system 100 (FIG. 2). Methods consistent with the present disclosure may include at least some, but not all, of the steps illustrated in method 1400, performed in a different sequence. Furthermore, methods consistent with the present disclosure may include at least two or more steps in method 1400 performed overlapping in time, or almost simultaneously.

In some embodiments, at least one or more of the steps in method 1400 may be performed in a cloud computing environment, wherein a computer may include servers, such as a master server and a slave server. Accordingly, at least some of the steps illustrated in method 1400 may be performed in parallel in different processors, following separate computational threads. For example, each of the separate computational threads may be performed by at least one of the slave servers in each of multiple applications and processors dedicated to the specific computational thread.

Operation 1402 includes generating a circuit element of an electronic circuit layout on a graphical user interface. Operation 1404 includes generating an array group including a plurality of circuit elements. Each cell of the array group includes the same circuit element, and the array group is generated such that a change in an attribute of the array group is applied to each circuit element of the plurality of circuit elements.

Figure 15:
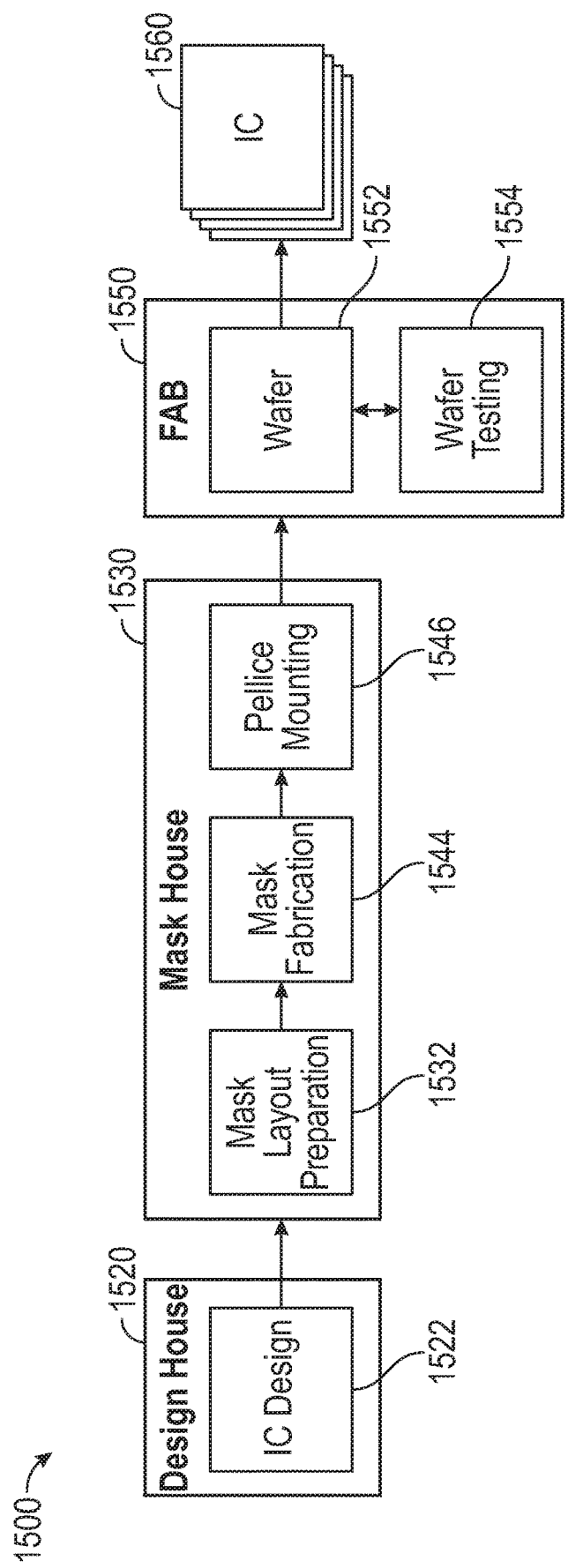
FIG. 15 is a schematic block diagram of an embodiment of an integrated circuit (IC) manufacturing system and an IC manufacturing flow associated with the IC manufacturing system.

FIG. 15 is a schematic block diagram of an embodiment of an integrated circuit (IC) manufacturing system 1500 and an IC manufacturing flow associated with the IC manufacturing system. The IC manufacturing system 1500 includes a plurality of entities, such as a design house 1520, a mask house 1530, and an IC manufacturer 1550 (e.g., a fab), that interact with one another in the design, development, and manufacturing cycles and/or services related to manufacturing an integrated circuit (IC) device 1560. The plurality of entities are connected by a communications network, which may be a single network or a variety of different networks, such as an intranet and the Internet, and may include wired and/or wireless communication channels. Each entity may interact with other entities and may provide services to and/or receive services from the other entities. The design house 1520, mask house 1530, and IC manufacturer 1550 may be a single entity or separate entities.

The design house (or design team) 1520 generates an electronic circuit layout (or IC design layout) 1522. The electronic circuit layout 1522 is generated using one or more techniques according to embodiments disclosed herein. The electronic circuit layout 1522 includes various geometrical patterns designed for an IC product, based on a specification of the IC product to be manufactured. The geometrical patterns correspond to patterns of metal, oxide, or semiconductor layers that make up the various components of the IC device 1560 to be fabricated. The various layers combine to form various IC features. For example, a portion of the electronic circuit layout 1522 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 1520 implements a proper design procedure, for example, using one or more of the techniques disclosed herein, to form the electronic circuit layout 1522. The design procedure may include logic design, physical design, and/or place and route. The electronic circuit layout 1522 is presented in one or more data files having information of the geometrical patterns. For example, the electronic circuit layout 1522 can be expressed in a GDSII file format, OASIS file format, or DFII file format.

The mask house 1530 uses the electronic circuit layout 1522 to manufacture one or more masks to be used for fabricating the various layers of the IC product according to the electronic circuit layout 1522. The mask house 1530 performs mask layout preparation 1532, where the electronic circuit layout 1522 is translated into a form that can be physically written by a mask writer. Commonly, an IC design may be replicated multiple times on a mask such that when radiation is passed through the mask during photolithography multiple copies of the IC design (or dies) may be formed within a single exposure field (or region) of a semiconductor wafer. As an aspect of this, during mask layout preparation 1532, the layout of the mask design may be determined including the location and number of dies to be formed within an exposure field, the location and width of scribe line regions (scribe lanes) around the dies, and the location and type of test structures to be formed on the wafer.

Additionally, mask layout preparation 1532 may include optical proximity correction (OPC) and a lithography process check (LPC) on the electronic circuit layout 1522 to compensate for image errors and simulate mask fabrication. The mask house 1530 also performs mask fabrication 1544, where the design layout prepared by the mask layout preparation 1532 is modified to comply with a particular mask writer and/or mask manufacturer and is then fabricated. In the present embodiment, the mask layout preparation 1532 and mask fabrication 1544 are illustrated as separate elements, however, the mask layout preparation 1532 and mask fabrication 1544 can be collectively referred to as mask data preparation.

During mask fabrication 1544, a mask or group of masks are fabricated based on the mask design layout which incorporates one or more copies of the electronic circuit layout 1522 as modified by mask layout preparation 1532. For example, an electron-beam (e-beam) or a mechanism of multiple e-beams is used to form a pattern on a mask (photomask or reticle) based on the mask design layout. The mask can be formed in various technologies. In one embodiment, the mask is formed using binary technology. In the present embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM as known in the art.

After a mask has been fabricated, the mask house performs a mask inspection to determine if the fabricated mask includes any defects, such as full-height and non-full-height defects. If any defects are detected, the mask may be cleaned or the mask design layout and/or IC design may be modified further depending on the types of defects detected.

If a mask passes inspection, it undergoes a pellicle mounting process 1546. Specifically, during the pellicle mounting process 1546, a pellicle is secured to the mask to prevent particles from falling onto the mask pattern and causing defects during subsequent lithography processes. A pellicle typically includes a thin film stretched across a frame that is secured to the mask by an adhesive or other semi-permanent or permanent fastener. The frame holds the film a distance above the mask pattern such that particles deposited on the film will be out of focus during illumination of the mask.

It should be understood that the above description of the mask layout preparation 1532 has been simplified for the purposes of clarity, and layout preparation may include additional features such as a logic operation (LOP) to modify the IC design layout according to manufacturing rules, a retarget process (RET) to modify the IC design layout to compensate for limitations in lithographic processes used by IC manufacturer 1550, and a mask rule check (MRC) to modify the IC design layout to compensate for limitations during mask fabrication 1544. Additionally, the processes applied to the electronic circuit layout 1522 during mask fabrication 1544 and mask inspection may be executed in a variety of different orders and may include a variety of different and/or additional steps.

The IC manufacturer 1550, such as a semiconductor foundry, uses the mask (or masks) fabricated by the mask house 1530 to fabricate a semiconductor wafer 1552 having a plurality of the IC devices 1560 thereon. The IC manufacturer 1550 is an IC fabrication business that can include a myriad of manufacturing facilities for the fabrication of a variety of different IC products. For example, there may be a manufacturing facility for the front end fabrication of a plurality of IC products (e.g., front-end-of-line (FEOL) fabrication), while a second manufacturing facility may provide the back end fabrication for the interconnection and packaging of the IC products (e.g., back-end-of-line (BEOL) fabrication), and a third manufacturing facility may provide other services for the foundry business. In the present embodiment, the semiconductor wafer 1552 is fabricated using the mask (or masks) to form a plurality of the IC devices 1560. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, in a deposition process (e.g., chemical vapor deposition (CVD) or physical vapor deposition (PVD)) to form a thin film in various regions on the semiconductor wafer, and/or other suitable processes. Further, during a photolithography process, light is passed though the mask (and pellicle) so as to transfer the pattern on the mask to the semiconductor wafer.

After a semiconductor wafer 1552 has been fabricated it may be subjected to wafer testing 1554 to ensure the integrated circuits formed thereon conform to physical manufacturing specifications and electrical performance specifications. After the semiconductor wafer 1552 passes wafer testing 1554, it may be diced (or sliced) along scribe lines to separate the IC devices 1560 formed thereon. The dicing process can be accomplished by scribing and breaking, by mechanical sawing (e.g., with a dicing saw) or by laser cutting. Following the dicing process, the plurality of IC devices 1560 are individually packaged for use in building electronic devices and, in some embodiments, may be subjected to further individual testing.

In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A computer-implemented method comprising:
    identifying a first instance of a circuit component of an electronic circuit layout on a graphical user interface; and
    replicating a change pertaining to the first instance to the electronic circuit layout at least by:
        determining, in the electronic circuit layout, an array group based at least in part upon an array configuration, wherein the array group is generated at least by programmatically replicating the first instance into at least one second instance based at least in part upon the array configuration; and
        replicating the change pertaining to the first instance to the at least one second instance based at least in part upon the array configuration for the array group.

2. The computer-implemented method of claim 1, further comprising:
    providing the electronic circuit layout for manufacturing a mask, the mask being used for fabricating an integrated circuit according to the electronic circuit layout.

3. The computer-implemented method of claim 1, wherein the at least one attribute includes a vertical spacing between first adjacent instances of the circuit component, a horizontal spacing between second adjacent instances of the circuit component, a number of rows in the array group, and a number of columns of the array group.

4. The computer-implemented method of claim 1, wherein the array group is generated such that a first change in a design of one instance of the first instance or the one or more second instances of the circuit component is programmatically replicated in at least one remaining instance first circuit of the circuit component.

5. The computer-implemented method of claim 1, further comprising:
programmatically updating second connectivity in response to replication the change to the at least one second instance, wherein the first instance and the at least one second instance respectively correspond to first connectivity and the second connectivity that is different from the first connectivity.

6. The computer-implemented method of claim 1, further comprising:
changing a number of instances of the circuit component in the array group at least by changing at least a size of the array group or one attribute pertaining to the array group.

7. The computer-implemented method of claim 6, wherein changing the at least one attribute includes changing a number of rows in the array group, a number of columns in the array group, or both.

8. The computer-implemented method of claim 1, wherein generating the array group including a plurality of first circuit elements comprises:
selecting the circuit component on the graphical user interface; and
changing one or more attributes of the array group to increase a number of instances of the circuit component in the array group.

9. The computer-implemented method of claim 1, further comprising:
separating the array group including multiple instances of the circuit component into two or more array subgroups, wherein each of the two or more array subgroups includes one or more instances of the circuit component from the multiple instances of the circuit component in the array group.

10. The computer-implemented method of claim 1, wherein generating the array group includes:
generating multiple instances of the circuit component of the electronic circuit layout;
selecting two or more instances of the circuit component of the multiple instances of the circuit component; and
binding the two or more instances of the circuit component with the array group.

11. The computer-implemented method of claim 1, further comprising:
separating at least one instance of the first instance and the one or more second instance of the circuit component in the array group into an individual instance.

12. A non-transitory computer-readable storage medium having instructions stored thereon a sequence of instructions, which when executed by a computer, causes the computer to perform a set of acts, the set of acts comprising;
identifying a first instance of a circuit component of an electronic circuit layout on a graphical user interface; and
replicating a change pertaining to the first instance to the electronic circuit layout at least by:
determining, in the electronic circuit layout, an array group including the first instance and one or more second instances of the circuit component, wherein at least by programmatically replicating the first instance based at least in part upon an array configuration; and
replicating the change in pertaining to the first instance to the one or more second instances based at least in part upon a grouping relation defined by the array group.

13. The computer-readable storage medium of claim 12, wherein a first change in a design of one instance of the circuit component is programmatically replicated in at least one other instance of the circuit component.

14. The computer-readable storage medium of claim 12, wherein the method further comprises:
changing a number of instance of the circuit component in the array group at least by changing a number of rows in the array group, a number of columns in the array group, or both.

15. The computer-readable storage medium of claim 12, wherein the at least one attribute includes a vertical spacing between first adjacent instances of the circuit component, a horizontal spacing between second adjacent instances of the circuit component, a number of rows in the array group, or a number of columns of the array group.

16. The computer-readable storage medium of claim 12, further comprising:
separating the array group including multiple instances of the circuit component into two or more array subgroups, each of the two or more array subgroups including one or more instances of the circuit component from the multiple instances of the circuit component in the array group.

17. The computer-readable storage medium of claim 12, further comprising:
separating at least one instance of the first and the one or more second instances of the circuit component in the array group into an individual instance.

18. A system comprising:
a user interface for displaying an electronic circuit layout of an integrated circuit;
a memory device storing instructions; and
a processor configured to execute the instructions for performing a set of acts for modifying the electronic circuit layout using one or more electronic design automation (EDA) tools, the set of acts comprising:
identifying a first instance of a circuit component of the electronic circuit layout; and
replicating a change pertaining to the first instance to the electronic circuit layout at least by:
determining, in the electronic circuit layout, an array group including the first instance and one or more second instance of the circuit component, wherein the array group is generated at least by programmatically replicating the first instance based at least in part upon an array configuration; and
replicating the change pertaining to the first instance to the one or more second instance based at least in part upon a group relation defined by the array group.

19. The system of claim 18, wherein the method for set of acts comprising modifying the electronic circuit layout further comprises:
changing a number of rows in the array group, a number of columns in the array group, or both.

20. The system of claim 18, wherein the set of acts comprising modifying the electronic circuit layout further comprises:

changing a vertical spacing between first adjacent instances of the circuit component in the array group, changing a horizontal spacing between second adjacent instances of the circuit component in the array group, or both.

* * * * *